United States Patent [19]

Repschläger et al.

[11] Patent Number: 4,956,551
[45] Date of Patent: Sep. 11, 1990

[54] SENSOR FOR CONSUMPTION MEASUREMENTS IN A HOUSEHOLD MEASURING SYSTEM

[75] Inventors: Horst Repschläger, Aachen; Heinz Riemer, Cologne, both of Fed. Rep. of Germany

[73] Assignee: Infas Institut Fur Angewandte Sozialwissenscheft GmbH, Fed. Rep. of Germany

[21] Appl. No.: 276,521

[22] Filed: Nov. 28, 1988

[30] Foreign Application Priority Data

Dec. 3, 1987 [DE] Fed. Rep. of Germany ....... 3740974
Dec. 12, 1987 [DE] Fed. Rep. of Germany ....... 3742249

[51] Int. Cl.$^5$ .......................... G01D 5/30; H01J 5/02
[52] U.S. Cl. .......................... 250/231.14; 250/231.17; 250/239
[58] Field of Search ............. 250/231 SE, 237 G, 239, 250/231.14, 231.17; 324/175; 341/13

[56] References Cited

U.S. PATENT DOCUMENTS 4,204,115  5/1980  Boldridge, Jr. ............... 250/231 SE
4,282,430  8/1981  Hatten et al. ....................... 250/239

FOREIGN PATENT DOCUMENTS 2814934 10/1979 Fed. Rep. of Germany .
3042411  6/1982 Fed. Rep. of Germany .

OTHER PUBLICATIONS

Eigenschaften und Anwendungen von Reflexlichtschranken, Von Dipl.-Ing. R. H. Dollwetzel, Muenchen–Feinwerktechnik & Messtechnik 93 (1985).

Primary Examiner—Edward P. Westin
Attorney, Agent, or Firm—Sixbey, Friedman, Leedom & Ferguson

[57] ABSTRACT

A sensor (1) for consumption measurements in a household consumption measuring system, in which the household consumption measuring system exhibits, as consumption measuring devices, in particular, a standard electricity meter, a standard gas meter and/or a standard water meter having a display element (2) of the consumption measuring device placed behind a transparent cover plate (4). The sensor (1) has a housing (6) with an outlet side (7) and, in the housing (6), a reflex photoelectric barrier emitter (8) and a reflex photoelectric barrier receiver (9) are placed next to each other at the outlet side (7). The sensor (1) is connected to an evaluation unit, can be produced especially economically and, in particular, can be installed on a consumption measuring device also simply and economically by setting housing (6) of the sensor with its outlet side (7) on cover plate (4) of the consumption measuring device and fastening it thereto. The position of reflex photoelectric barrier emitter (8) and reflex photoelectric barrier receiver (9) is adjustable in the housing (6) both mutually and with respect to outlet side (7) of housing (6). The reflex photoelectric barrier emitter (8) and reflex photoelectric barrier receiver (9) are aligned operatively with display element (2) of the consumption measuring device.

7 Claims, 3 Drawing Sheets

SENSOR FOR CONSUMPTION MEASUREMENTS IN A HOUSEHOLD MEASURING SYSTEM

The invention relates to a sensor for consumption measurements in a household consumption measuring system. In particular, such measuring systems as are used as gas, electricity and/or water meters wherein a display element is disposed behind a transparent cover plate, on the outer side of which a sensor having a reflex barrier photoelectric emitter and receiver is disposed.

Even in private households, a systematic determination of the consumption of energy of all kinds, as well as of cold and hot water, is becoming increasingly important. The prior art in this field shows that, for the various types of energy and for water consumption, normally various specially adapted sensors are used, namely for electrical energy an active-power transducer, for gas, a counting mechanism coupled mechanically to a gas meter and for water consumption an impeller meter or a special flow counter. Special sensors for measurement of consumption of various kinds of energy and of water are expensive, they can be used only in the context of studies on a limited scale. Studies on a large scale, for example in several hundred or several thousand households, to be able to observe long-term developments in energy consumption, require extremely economical measuring methods.

There is also known a reflex sensor, with reflex photoelectric barrier emitters and reflex photoelectric barrier receivers (German Offenlegungsschrift No. 30 42 411) that is placed inside a standard gas meter. The known sensor is placed on one side of an adjusting toothed wheel on whose other side a reflector plate, consisting of reflective material, is attached. From the reflex sensor a light beam is emitted which passes through the gaps between each pair of teeth of the adjusting toothed wheel, strikes the reflector plate and is reflected from there into the reflex sensor. The pulse train produced by the teeth of the adjusting toothed wheel interrupting the light beam is registered and evaluated by an evaluation unit.

For a systematic determination of energy consumption etc., in private households, the known sensor mentioned above is not suited, or is suited only in the framework of studies on a limited scale, because of the considerable expense thereof. However, studies on a large scale, for example in several hundred or several thousand households, which are necessary to be able to observe long-term developments in energy consumption, need an extremely economical measuring method which, in addition, should be as all-purpose as possible, i.e., be usable with all consumption measuring devices present in the standard household.

SUMMARY OF THE INVENTION

In consideration of the problem explained above, a primary object of the invention is to create a sensor of general utility that can be used in combination with a wide variety of standard household consumption measuring devices.

It is a further object to enable a sensor meeting the primary object to be produced especially economically and, in particular, so that it can also be installed on a consumption measuring device simply and economically.

The reflex photoelectric barrier method known from the prior art is such that it can be used in household consumption measuring systems. But for all-purpose use of a reflex photoelectric barrier, use that is economical from an installation viewpoint, it is essential that it be placed in a separate housing that, at its outlet side, can be set onto the outside of the cover plate of the respective consumption measuring device and fastened to it. Because this essential capability is present in the sensor according to the invention, it can be attached to all consumption measuring devices of the type mentioned, i.e., it forms an all-purpose sensor that can, for example, be used for an electricity meter, a gas meter, a water meter etc. in a household. Additionally, the all-purpose nature of the sensor according to the invention requires that the alignment of the reflex photoelectric barrier emitter and the reflex photoelectric barrier receiver be able to be changed with respect to the housing and thus with respect to the cover plate of the respective consumption measuring device, and the design of the sensor according to the invention takes this into consideration.

These and further objects, features and advantages of the present invention will become more obvious from the following description when taken in connection with the accompanying drawings which show, for purposes of illustration only, several embodiments in accordance with the present invention.

DETAILED DESCRIPTION OF THE PREFERRED EMBODIMENT

Figure 1:
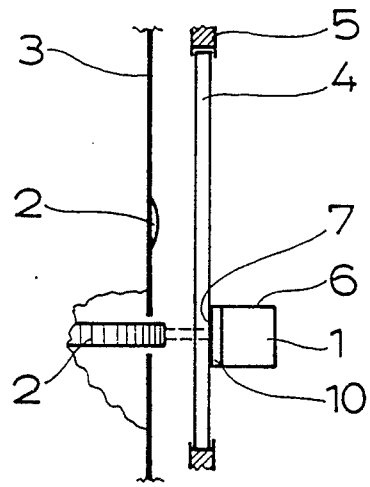
FIG. 1 is a diagrammatic representation, seen from the side, of an embodiment of a sensor according to the invention on a consumption measuring device in the form of an electricity meter.

Sensor 1, represented diagrammatically in FIG. 1, is intended and suited for consumption measurements in a household consumption measuring system. Such a household consumption measuring system includes a multiplicity of types of consumption measuring devices, such as standard electricity meters and standard water meters, as well as sometimes, also, standard gas meters, district-heat meters, etc. Common to the consumption measuring devices of a household consumption measuring system of the types mentioned above is the fact that their display elements 2, in their actual measurement part 3, are placed behind a transparent cover plate 4. Usually, such a sensor 1 is connected to an electric or electronic evaluation unit.

FIG. 1 shows cover plate 4 on an electricity meter as an example of a consumption measuring device and, behind it, a display element 2, here in the form of an aluminum wheel that rotates around a vertical axis and is provided with a red mark on its edge. Above the aluminum wheel there is a roller register, that is usually provided in electricity meters, which serves as another display element 2. Cover plate 4 is built into a housing 5 of the consumption measuring device, only a portion of which is depicted.

In sensor 1 according to the invention, it is essential that a housing 6 is provided with an outlet side 7 that can be set on cover plate 4 of a consumption measuring device and, in housing 6, a reflex photoelectric barrier emitter 8 and a reflex photoelectric barrier receiver 9 are placed next to each other on outlet side 7. In this regard, housing 6, preferably with outlet side 7, can be fastened, in particular glued, onto cover plate 4 and reflex photoelectric barrier emitter 8 and reflex photoelectric barrier receiver 9 aligned with display element 2 of the consumption measuring device. In the embodiment represented, housing 6 is covered on outlet side 7 by a transparent outlet plate 10 and is glued with it directly to cover plate 4 of the consumption measuring device. As an adhesive, a material is used that has approximately the same refraction index as the synthetic glass used for both plates.

In the embodiment represented here, reflex photoelectric barrier emitter 8 is a light-emitting diode and reflex photoelectric barrier receiver 9 is a phototransistor, a photodiode, a photoresistor or the like. The type of light-emitting diodes and light-receiving elements is determined according to the specific application. In this particular respect, there exists extensive general prior art to which reference may be made.

FIG. 2 of the drawing, again, shows the arrangement of sensor 1 according to the invention on housing 4 enclosing display element 2. Represented in exaggerated form is a mark 11 on display element 2, which here has the form of an aluminum wheel of a electricity meter. This mark 11 generally has a certain color, usually red or black. The embodiment represented is distinguished in that reflex photoelectric barrier emitter 8 emits a light of a wavelength that is not, or is hardly, reflected by mark 11 of display element 2 and in that, on photoelectric barrier receiver 9, the absence of reflected light can be evaluated as a set-point signal. According to the invention, thus, the reflex photoelectric barrier, works in a certain wavelength range and, from an evaluation technology viewpoint, "in reverse" to a certain extent, to normal reflex photoelectric barriers.

Above, it was indicated that reflex photoelectric barrier emitter 8 and reflex photoelectric barrier receiver 9 should be aligned with display element 2 of the consumption measuring device. For all-purpose applicability of sensor 1 according to the invention, this alignment must be variable, since, especially the longitudinal distance to respective display element 2 is different in the various consumption measuring devices. In this respect it is advisable that the position of reflex photoelectric barrier emitter 8 and of reflex photoelectric barrier receiver 9 be adjustable in housing 6, both mutually and with respect to outlet side 7. In the field of optoelectronic proximity switches there are various techniques of achieving such adjustability.

Figure 2:
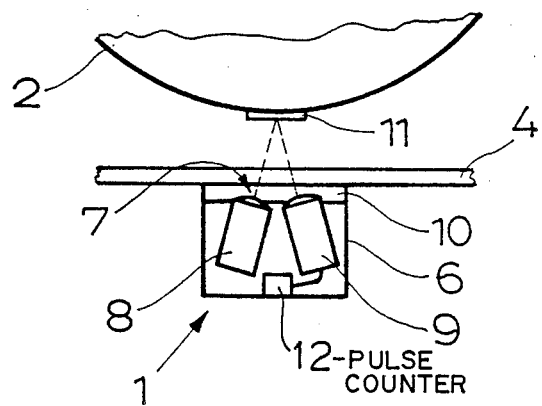
FIG. 2 shows a top view of the embodiment of FIG. 1.

It has already been explained above that, in the embodiment represented here, outlet side 7 of housing 6 is covered by an outlet plate 10. As represented in FIG. 2, a direct attachment of reflex photoelectric barrier emitter 8 and reflex photoelectric barrier receiver 9 to outlet plate 10 can be achieved if the outlet plate is made sufficiently thick. Such an arrangement is especially suitable with light emitting diodes and phototransistors that are of a partially spherical shape. In this way, the optical losses can be kept small by the different refraction effects, that are obtainable by forming the inner side of outlet plate 10 with recesses, which may be cup-shaped, to match the shape of the emitter 8 and receiver 9. The outlet plate could, in addition, also be made of an elastic silicon or the like that is transparent for the suitable wavelengths. As a further alternative, the outlet plate on the outlet side of the housing may be omitted and the housing wall at that side merely provided with a hole for the emitter 8 and one for the receiver 9.

Figure 3:
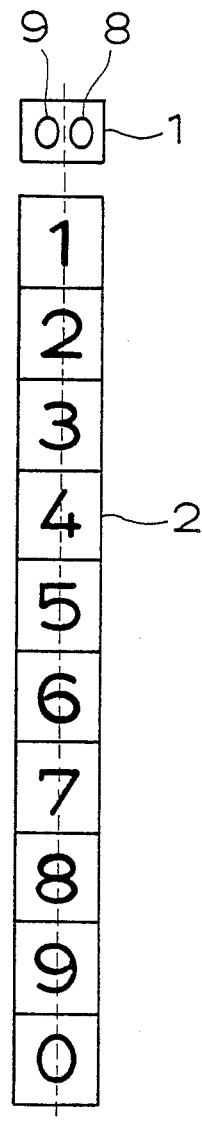
FIG. 3 is a diagrammatic representation of the scanning principle for a sensor according to the invention in combination with a roller register of a gas meter.

FIG. 3 shows how sensor 1, usable as an all-purpose sensor, can be used in a roller register of a gas meter. At every "black passage," a pulse is triggered on reflex photoelectric barrier receiver 9 for a complete rotation of the roller register in the last position, i.e., a total of 25 pulses. A pulse counter 12, for receiving the output of barrier receiver 9, is usually arranged next to the reflex photoelectric barrier receiver, and, in this case, provides a pulse scaling down of 25:1, so that finally, an output pulse is given off by sensor 1 at every complete rotation from the last position of the roller register.

Sensor 1 for consumption measurements can also be used as a status indicator for doors and windows in a household, so that consumption measurements, for example, for heat energy, can be evaluated in relation to whether heat energy had to be used because of great outside cold, because of poor effectiveness or simply because of open doors.

As applied in a water meter, sensor 1 can be aligned with the red indicator of the water meter, and it can be glued on the cover plate of a water meter in the same way as explained above with regard to the electricity meter.

Of course, a sensitivity adjustment of sensor 1 must be able to be achieved electronically with servomechanisms.

As has been indicated several times above, an essential aspect of the invention lies in drastically simplifying a household consumption measuring system by using a structurally uniform sensor suitable for all consumption measuring devices of the type having a transparent cover plate and a display element behind it, so that it can be used extensively and economically. Generally, this also means that the sensor for consumption measurements in a household consumption measuring system can also be used for consumption measurements that are perfomed by energy supply companies for billing purposes or the like.

Figure 4:
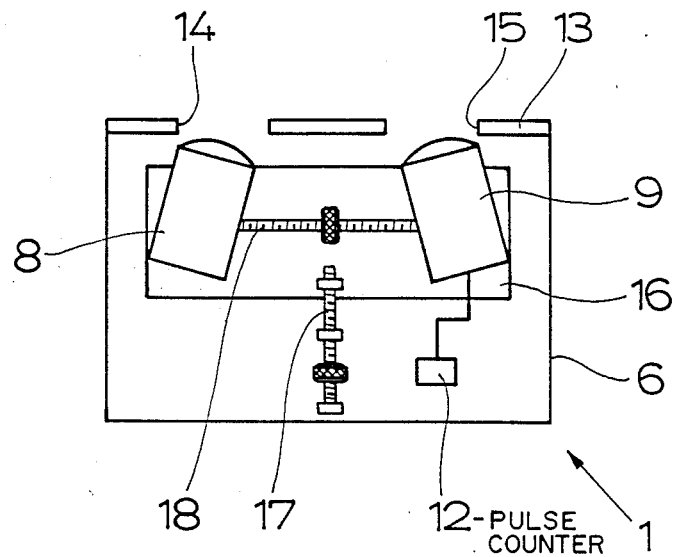
FIG. 4 is a top view of another embodiment of a sensor according to the invention.

FIG. 4 shows another embodiment of the sensor 1. Here, the outlet side 13 of the housing 6 is closed except for a through hole 14 for the reflex photoelectric barrier emitter 8 as well as a through hole 15 for the reflex photoelectric barrier receiver 9. Both emitter 8 and receiver 9 are positioned on a platform 16 that may be moved longitudinally relative to the housing 6 through longitudinal adjustment means 17. Those longitudinal adjustment means 17 are well known in the art and are shown here as a screw spindel drive. Similarly the emitter 8 and receiver 9 are adjustable relative to each other through transversal adjustment means 18, constructed as a screw spindel drive in this embodiment as well. Of course, emitter 8 and receiver 9 are pivotably positioned on the platform 16 so that they will pivot symmetrically as the transversal adjustment means 18 is operated.

While we have shown and described various embodiments in accordance with the present invention, it is understood that the same is not limited thereto, but is susceptible of numerous changes and modifications as known to those skilled in the art, and we, therefore, do not wish to be limited to the details shown and described herein, but intend to cover all such changes and modifications as are encompassed by the scope of the appended claims.

We claim:

1. Sensor, for consumption measurements in a household consumption measuring system having a measuring device, such as at least one of an electricity meter, a gas meter, a water meter and the like, with a display element placed behind a transparent cover plate, said sensor comprising a housing with an outlet side and a reflex photoelectric barrier emitter and a reflex photoelectric barrier receiver arranged next to each other in said housing on the outlet side thereof, wherein the housing of the sensor is constructed for mounting of its outlet side on the cover plate of the consumption measuring devices, wherein the position of the reflex photoelectric barrier emitter and of the reflex photoelectric barrier receiver is adjustable in said housing, both mutually and relative to said outlet side of the housing for enabling the reflex photoelectric barrier emitter and reflex photoelectric barrier receiver to be operatively aligned with the display element of the consumption measuring device, wherein the outlet side of the housing is covered by a transparent outlet plate, and wherein the transparent outlet plate is provided, on its inner side, with cup-shaped recesses that are matched to emitting and receiving surfaces of the reflex photoelectric barrier emitter and reflex photoelectric barrier receiver, respectively, said recesses serving as a means for reducing optical losses.

2. Sensor according to claim 1, wherein the reflex photoelectric barrier emitter comprises means for emitting light of a wavelength that is substantially nonreflectable by a mark of the display element, and wherein the reflex photoelectric barrier receiver is responsive to the absence of reflected light for producing a set-point signal.

3. Sensor according to claim 1, wherein a pulse counter is connected to the reflex photoelectric barrier receiver.

4. Household consumption measuring system with at least one of several consumption measuring devices including an electricity meter, a gas meter and a water meter, and each meter having a display element placed behind a transparent cover plate; wherein a sensor for consumption measuring is provided for each meter, each sensor comprising a housing with an outlet side and a reflex photoelectric barrier emitter and a reflex photoelectric barrier receiver arranged next to each other in said housing on the outlet side thereof, wherein the housing of the sensor is mounted, by its outlet side, on the cover plate of the consumption measuring device, wherein the position of the reflex photoelectric barrier emitter and of the reflex photoelectric barrier receiver is adjustable in said housing, both mutually and relative to said outlet side of the housing for enabling the reflex photoelectric barrier emitter and reflex photoelectric barrier receiver to be operatively aligned with the display element of the consumption measuring device, wherein the outlet side of the housing is covered by a transparent outlet plate, and wherein the transparent outlet plate is provided, on its inner side, with cup-shaped recesses that are matched to emitting and receiving surfaces of the reflex photoelectric barrier emitter and reflex photoelectric barrier receiver, respectively, said recesses serving as a means for reducing optical losses.

5. System according to claim 4, wherein the reflex photoelectric barrier emitter comprises means for emitting light of a wavelength that is substantially nonreflectable by a mark of the display element, and wherein the reflex photoelectric barrier receiver is responsive to the absence of reflected light for producing a set-point signal.

6. System according to claim 4, wherein a pulse counter is connected to the reflex photoelectric barrier receiver.

7. System according to claim 4, wherein the transparent outlet plate is glued to said transparent cover plate with an adhesive material having approximately the same refractive index as the refractive index of both the outlet plate and cover plate.

* * * * *